United States Patent [19]
Tanaka et al.

[11] Patent Number: 4,808,812
[45] Date of Patent: Feb. 28, 1989

[54] COMPOSITE TYPE LIGHT SENSOR HAVING PLURAL SENSORS WITH DIFFERENT LIGHT RECEIVING ANGLE OPTICAL CHARACTERISTICS

[75] Inventors: Akira Tanaka, Utsunomiya; Shigeru Kimura, Yokohama; Toshiaki Ikeda, Yokohama; Toru Tanabe, Yokohama; Seiichi Suto, Hiratsuka; Takao Seto, Yokohama, all of Japan

[73] Assignees: Honda Motor Co., Ltd.; Stanley Electric Co., Ltd., both of Tokyo, Japan

[21] Appl. No.: 62,442

[22] Filed: Jun. 11, 1987

[30] Foreign Application Priority Data

Jun. 19, 1986 [JP] Japan .................................. 61-143902

[51] Int. Cl.⁴ .............................................. H01J 3/14
[52] U.S. Cl. .................................... 250/216; 250/239
[58] Field of Search ................ 250/216, 239; 350/511, 350/557; 357/30 M, 19

[56] References Cited

U.S. PATENT DOCUMENTS

| | | | |
|---|---|---|---|
| 3,891,858 | 6/1975 | Schoberl | 250/239 |
| 4,055,761 | 10/1977 | Shimomura | 250/239 |
| 4,309,605 | 1/1982 | Okabe | 250/239 |
| 4,331,868 | 5/1982 | Mash | 250/239 |
| 4,425,501 | 1/1984 | Stauffer | 250/216 |
| 4,528,446 | 7/1985 | Dunaway et al. | 250/216 |
| 4,587,421 | 5/1986 | Robertson | 250/239 |
| 4,650,998 | 3/1987 | Martin | 250/239 |
| 4,667,092 | 5/1987 | Ishihara | 250/216 |
| 4,695,719 | 9/1987 | Wilwerding | 250/239 |

*Primary Examiner*—David C. Nelms
*Attorney, Agent, or Firm*—Frishauf, Holtz, Goodman & Woodward

[57] ABSTRACT

A composite type light sensor compriser of a sensor portion molded into a light-transmitting resin together with light receiving elements and a case portion mounted with light receiving means such as a lens for receiving the sensor portion.

17 Claims, 2 Drawing Sheets

COMPOSITE TYPE LIGHT SENSOR HAVING PLURAL SENSORS WITH DIFFERENT LIGHT RECEIVING ANGLE OPTICAL CHARACTERISTICS

BACKGROUND OF THE INVENTION

1. FIELD OF THE INVENTION

The present invention relates to a light sensor for detecting the illumination of external light, and more particularly to a composite-type light sensor in which a plurality of light-receiving elements are integrally mounted in a single unit for measuring illumination of different types; for example a circumferential light and a forward light are measured when a head lamp of an automobile is automatically energized.

2. DESCRIPTION OF THE PRIOR ART

Hitherto, there has been needed separate light sensors for achieving different light measuring objectives, respectively, such as for measuring an average illumination and for measuring a partial illumination.

Such conventional sensors create problems since it is difficult to make small the size of the sensor since a plurality of separate light sensors are required, and since it is necessary to adjust the mounting direction of the light sensors, thereby requiring a complex process for manufacturing the light sensor.

SUMMARY OF THE INVENTION

The object of the present invention is to overcome the above-mentioned problems of the conventional light sensor and to provide a composite-type light sensor comprising a sensor portion in which light-receiving elements are molded together by a light-transmitting molded resin, and a case portion for receiving the sensor portion and including light-receiving means such as a lens. The sensor portion comprises at least two light-receiving elements which are integrally molded in the light-transmitting molded resin so as to form a light-receiving portion at the front of the light-receiving elements. The light-receiving means of the case portion is formed such that the light-receiving elements of the sensor portion are respectively provided with different optical characteristics, such as different light-receiving angles.

DETAILED DESCRIPTION OF THE INVENTION

Figure 1:
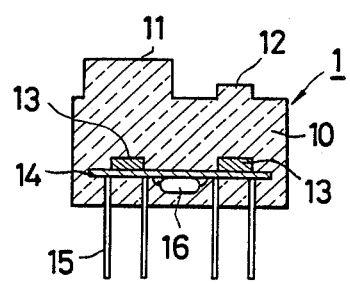
FIG. 1 is a sectional view showing an embodiment of the composite-type light sensor of the present invention.
Figure 2:
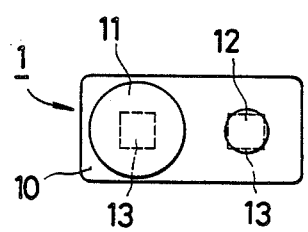
FIG. 2 is a front view of the composite-type light sensor of FIG. 1.

In FIGS. 1 and 2 showing the most basic sensor portion 1 of a composite-type light sensor of the present invention, the sensor portion 1 has two light-receiving elements 13 such as photodiodes integrally molded in epoxy resin or the like, thereby forming a molded package 10. There are provided at the respective front portions of the light-receiving elements 13, two light receiving portions 11 and 12 formed in the epoxy resin so as to provide a respective suitable optical characteristic such as a light-receiving angle required for each of the light-receiving elements 13 in the molded package 10. The light-receiving elements 13 are previously mounted at a predetermined position on a ceramic substrate 14 and are connected with lead wires 15. Therefore they are easily fabricated and further it is also possible to incorporate an amplifying circuit for the light-receiving elements 13 into the ceramic substrate 14. In FIG. 1, numeral 16 shows an example of such an amplifying circuit mounted on the ceramic substrate 14. Amplifying circuit 16 is also molded into the resin package 10 as seen in FIG. 1.

Figure 3:
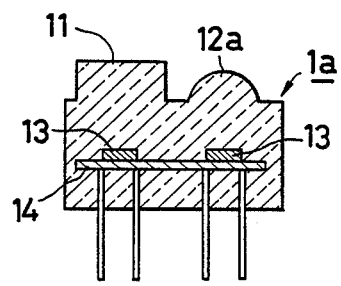
FIG. 3 is a sectional view showing another embodiment of the present invention.

Referring to FIG. 3, another embodiment of the molded package 10a of the sensor portion 1a of a composite-type light sensor of the present invention is shown. One of the light-receiving portions shown by numeral 12a is formed or molded in a spherical shape. As shown in this embodiment, the light-receiving portions 11, 12a may be made to any shape suitable for the light-receiving object. The remaining portions except for the light-receiving portion 12a in FIG. 3 are the same as those in FIGS. 1 and 2. Therefore, explanations thereof are omitted.

Figure 4:
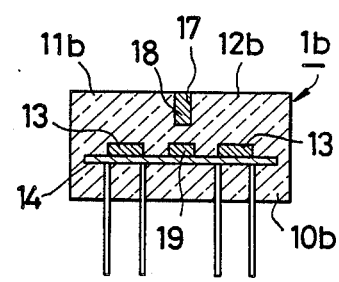
FIG. 4 is a sectional view showing still another embodiment of the present invention.
Figure 5:
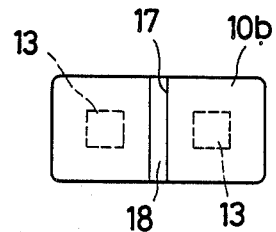
FIG. 5 is a front view of the embodiment shown in FIG. 4.

Referring to FIGS. 4 and 5, still another embodiment of the molded package 10b of the sensor portion 1b of the present invention is shown. As shown in FIGS. 4 and 5, there is provided a slit-like recess portion 17 having a suitable width at the center position of the region between the light-receiving portions 11b and 12b of the molded package 10b in which respective light-receiving elements 13 are molded. Opaque material 18 is received in the slit-like recess portion 17. By this arrangement there is provided a shading portion for avoiding the light incident on, for example, the light-receiving portion 11b, to reach the other light-receiving element 13 below light-receiving portion 12b. Furthermore, an external light is hardly incident to the lower portion of the slit-like recess portion 17. Therefore, it is preferable to install a semiconductor integrated circuit chip used as an amplifier for the light-receiving elements 13 at the position below recess portion 17, as shown by numeral 19 in FIG. 4, thereby avoiding any malfunction of the amplifier 19 due to external light. The remaining portions, except the members mentioned above in this embodiment, are the same as those in FIGS. 1, 2 and 3, and therefore explanation thereof is omitted.

Figure 6:
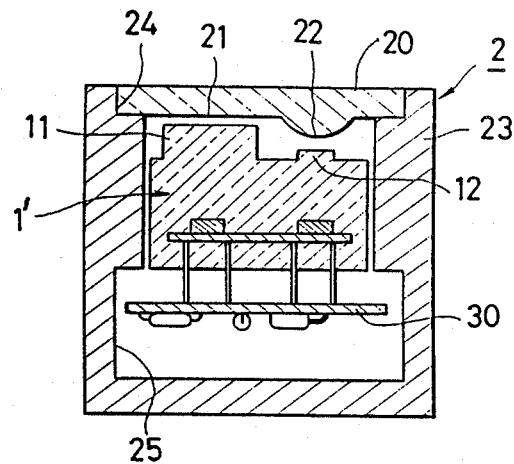
FIG. 6 is a sectional view showing an embodiment of the present invention in which a sensor portion is mounted in a case portion.

Referring to FIG. 6, there is shown a case portion 2 of the present invention within which a sensor portion 1', similar to that shown in FIG. 1 is mounted. The sensor portion 1' may, of course, be replaced by the sensor portion 1, 1a or 1b shown in FIG. 1, 3 or 4, respectively. The case portion 2 comprises a front lens 20 made of a light-transmitting resin and a holder case portion 23 made of a non-light-transmitting resin. The front lens 20 has light-receiving lenses 21 and 22 serving as light-receiving means which respectively correspond to the light-receiving portions 11 and 12 of the sensor portion 1'. In this embodiment, one of the light-receiving lenses 21 is made in a flat shape in order to widen the light-receiving angle and the other of the light-receiving lenses 22 is made in a convex lens shape in order to make narrow the light-receiving angle. Thus, the shape of the light-receiving lenses may be made in accordance with the light measuring objective. It is possible to provide a slit-like shading portion 17, 18 as shown in the embodiment of FIGS. 4 and 5 on the front lens 20. There are provided in the holder case 23 a lens receiving portion (ledge) 24 for receiving and mounting the front lens 20 and a circuit case portion (cavity) 25 for receiving a drive circuit 30 of the sensor portion 1'.

Figure 7:
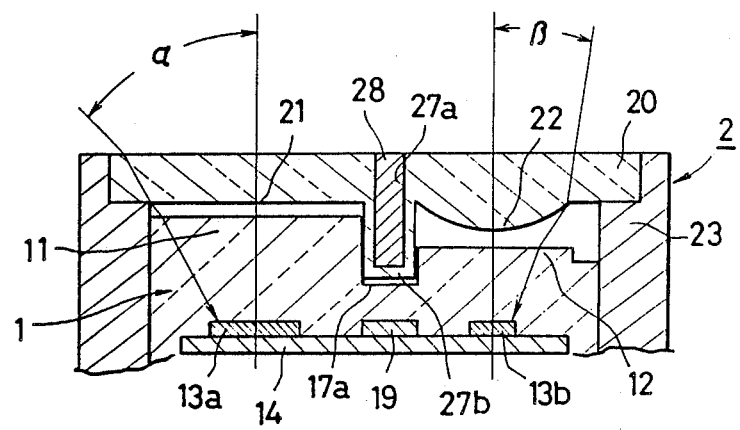
FIG. 7 is an enlarged sectional view showing in detail another embodiment of a combination of a sensor portion and a case portion according to the present invention.

Referring to FIG. 7 the main portion of a composite-type light sensor of the present invention is shown in an enlarged scale. There is provided a shading portion as mentioned above on the front lens 20. The shading portion comprises a non-light-transmitting material 28 fitted into a slit-like recess portion 27a mounted in the front lens 20. Furthermore, there are provided a slit-like recess 17a on the sensor portion 1 and a projecting portion 27b at the back of the slit-like recess portion 27a, the projecting portion 27b being fitted into the slit-like recess portion 17a for correctly positioning the light-receiving lenses 21 and 22 opposite the light-receiving portions 11 and 12, respectively, when the sensor portion 1 is received in the case portion 2. By this arrangement, a high precision in the fabrication thereof is easily maintained and manufacturing errors are prevented.

According to the arrangement as mentioned above, since the light-receiving portion 11 is made wide with respect to the light-receiving element 13a and the light-receiving lens 21 is made in a flat shape, an optical characteristic having a light-receiving angle α of about 45° is obtained. On the other hand, the light-receiving portion 12 is made narrower with respect to the light-receiving element 13b, and the light-receiving lens 22 is made in a spherical shape. Therefore, an optical characteristic having a light-receiving angle β of about 3.5° is obtained. Thus, two measuring objects are achieved.

As mentioned above, according to the composite-type light sensor of the present invention, the sensor portion has at least two light-receiving elements molded into the light-transmitting resin, the front portion of the light-receiving elements is made as a light-receiving portion, and the light-receiving means of the case portion is formed so as to provide different optical characteristics such as different light-receiving angles through the light-receiving portion of the sensor portion with respect to the light-receiving elements respectively. Therefore, it is possible for a single sensor to detect illumination from different directions such as wide angle range and narrow angle range of front and inclined directions, to minimize the number of parts, thereby making the sensor compact, to shade the incident light, thereby increasing the reliability of the sensor, and to make easy the relative positioning of the parts.

What is claimed is:

1. A composite-type light sensor comprising:
    a sensor portion including at least two light-receiving elements integrally molded as a single unit into a light-transmitting resin to form a single unit sensor portion; and
    a case portion for receiving said sensor portion therein, said case portion including respective different light-receiving means having respective different light receiving angle optical characteristics;
    said light-transmitting molded resin of said sensor portion defining different light-receiving portions in front of respective ones of said light-receiving elements, said different light-receiving portions having respective different light receiving angle optical characteristics;
    said different light-receiving portions of said sensor portion being arranged adjacent respective different light-receiving means of said case portion to receive light from said respective light-receiving means of said case portion; and
    said light-receiving means of said case portion and said light-receiving portions of said sensor portion cooperatively providing said light-receiving elements with respective different light-receiving angle optical characteristics.

2. The composite-type sensor of claim 1 wherein said light-receiving portion of said sensor portion comprises respective light-receiving areas adjacent each respective light-receiving element, the light-receiving area corresponding to at least one of said light-receiving elements having a spherically shaped portion to provide a given optical characteristic to said at least one light-receiving element in combination with said light-receiving means of said case portion.

3. The composite-type light sensor of claim 2, wherein at least one of said light-receiving portions of said sensor portion and said light-receiving means of said case portion comprises a shading portion including:
    a slit-like recess portion located between said light-receiving elements; and
    a substantially non-light-transmitting material in said slit-like recess portion.

4. The composite-type light sensor of claim 3, wherein at least one of said sensor portions and said case portion further comprises a semiconductor integrated circuit chip at the back of said shading portion.

5. The composite-type light sensor of claim 4, wherein said sensor portion includes a recess, and said light-receiving
    means of said case portion includes a projecting portion arranged to be received in said recess of said sensor portion when said sensor portion is received in said case portion, thereby serving as a positioning guide for determining the mutual positions of said light-receiving means of said case portion and said light-receiving elements of said sensor portion.

6. The composite-type light sensor of claim 2, wherein said sensor portion comprises a second light-receiving portion having a substantially flat light-receiving area.

7. The composite-type light sensor of claim 6, wherein at least one of said light-receiving portion of said sensor portion and said light-receiving means of said case portion comprises a shading portion including:
    a slit-like recess portion located between said light-receiving elements; and
    a substantially non-light-transmitting material in said slit-like recess portion.

8. The composite-type light sensor of claim 7, wherein at least one of said sensor portions and said case portion further comprises a semiconductor integrated circuit chip at the back of said shading portion.

9. The composite-type light sensor of claim 1, wherein said sensor portion comprises at least two spaced apart, substantially flat, light-receiving areas having different optical characteristics.

10. The composite-type light sensor of claim 9, wherein at least one of said light-receiving portions of said sensor portion and said light-receiving means of said case portion comprises a shading portion including:
   a slit-like recess portion located between light-receiving elements; and
   a substantially non-light-transmitting material in said slit-like recess portion.

11. The composite-type light sensor of claim 10, wherein at least one of said sensor portions and said case portion further comprises a semiconductor integrated circuit chip at the back of said shading portion.

12. The composite-type light sensor of claim 11, wherein said sensor portion includes a recess, and said light-receiving means of said case portion includes a projecting portion arranged to be received in said recess of said sensor portion when said sensor portion is received in said case portion, thereby serving as a positioning guide for determining the mutual positions of said light-receiving means of said case portion and said light-receiving elements of said sensor portion.

13. The composite-type light sensor of claim 1, wherein at least one of said light-receiving portions of said sensor portion and said light-receiving means of said case portion comprises a shading portion including:
   a slit-like recess portion located between said light-receiving elements; and
   a substantially non-light-transmitting material in said slit-like recess portion.

14. The composite-type light sensor of claim 13, wherein at least one of said sensor portion and said case portions further comprises a semiconductor integrated circuit chip at the back of said shading portion.

15. The composite-type light sensor of claim 14, wherein said sensor portion includes a recess, and said light-receiving means of said case portion includes a projecting portion arranged to be received in said recess of said sensor portion when said sensor portion is received in said case portion, thereby serving as a positioning guide for determining the mutual positions of said light-receiving means of said case portion and said light-receiving elements of said sensor portion.

16. The composite-type light sensor of claim 1, wherein at least one of said sensor portions and said case portion further comprises a semiconductor integrated circuit chip at the back of said shading portion.

17. The composite-type light sensor of claim 1, wherein said sensor portion includes a recess, and said light-receiving means of said case portion includes a projecting portion arranged to be received in said recess of said sensor portion when said sensor portion is received in said case portion, thereby serving as a positioning guide for determining the mutual positions of said light-receiving means of said case portion and said light-receiving elements of said sensor portion.

* * * * *

UNITED STATES PATENT AND TRADEMARK OFFICE
CERTIFICATE OF CORRECTION

PATENT NO. : 4,808,812
DATED : February 28, 1989
INVENTOR(S) : Tanaka et al

It is certified that error appears in the above-identified patent and that said Letters Patent is hereby corrected as shown below:

In the Abstract, line 1, "compriser" should read --comprises--.

Column 4, line 58 (claim 7), "portion" should read --portions--.

Column 6, line 6 (claim 14), "portion" should read --portions--.

Column 6, line 7 (claim 14), "portions" should read --portion--.

Column 6, line 18 (claim 16), "of claim 1" should read --of claim 3--.

Signed and Sealed this

Seventeenth Day of April, 1990

Attest:

HARRY F. MANBECK, JR.

*Attesting Officer*  *Commissioner of Patents and Trademarks*